US011687281B2

(12) United States Patent
Shen et al.

(10) Patent No.: US 11,687,281 B2
(45) Date of Patent: Jun. 27, 2023

(54) DRAM COMMAND STREAK EFFICIENCY MANAGEMENT

(71) Applicant: Advanced Micro Devices, Inc., Santa Clara, CA (US)

(72) Inventors: Guanhao Shen, Austin, TX (US); Ravindra Nath Bhargava, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/219,535

(22) Filed: Mar. 31, 2021

(65) Prior Publication Data

US 2022/0317928 A1  Oct. 6, 2022

(51) Int. Cl.
*G06F 3/06* (2006.01)

(52) U.S. Cl.
CPC .......... *G06F 3/0659* (2013.01); *G06F 3/0604* (2013.01); *G06F 3/0673* (2013.01)

(58) Field of Classification Search
CPC .... G06F 3/0659; G06F 3/0604; G06F 3/0673; Y02D 10/00
See application file for complete search history.

(56) References Cited

U.S. PATENT DOCUMENTS

| | | | |
|---|---|---|---|
| 6,154,419 A | 11/2000 | Shakkarwar | |
| 6,332,206 B1 * | 12/2001 | Nakatsuji | ............... H03M 13/00 |
| 6,957,308 B1 * | 10/2005 | Patel | ....................... G06F 13/28 |
| | | | 711/167 |
| 2003/0026138 A1 * | 2/2003 | Lee | ..................... G11C 11/4082 |
| | | | 365/194 |
| 2009/0248994 A1 | 10/2009 | Zheng et al. | |
| 2011/0099341 A1 | 4/2011 | Resnick | |
| 2012/0131246 A1 | 5/2012 | Jeong et al. | |
| 2013/0086309 A1 * | 4/2013 | Lee | ..................... G06F 12/0246 |
| | | | 711/E12.008 |
| 2017/0140800 A1 | 5/2017 | Wingard et al. | |

(Continued)

FOREIGN PATENT DOCUMENTS

| | | | |
|---|---|---|---|
| JP | 2012113819 | * | 6/2012 |
| WO | 2017196142 A2 | | 11/2017 |

OTHER PUBLICATIONS

Agrawal, Aditya; "Understanding and Implementing DRAM Timings;" Nov. 11, 2018; available at: https://www.adityaagrawal.net/blog/architecture/dram_timing (Year: 2018).*

(Continued)

*Primary Examiner* — Hiep T Nguyen
(74) *Attorney, Agent, or Firm* — Polansky & Associates, P.L.L.C.; Paul J. Polansky; Nathan H. Calvert

(57) ABSTRACT

A memory controller includes a command queue and an arbiter for selecting entries from the command queue for transmission to a DRAM. The arbiter transacts streaks of consecutive read commands and streaks of consecutive write commands. The arbiter transacts a streak for at least a minimum burst length based on a number of commands of a designated type available to be selected by the arbiter. Following the minimum burst length, the arbiter decides to start a new streak of commands of a different type based on a first set of one or more conditions indicating intra-burst efficiency.

20 Claims, 5 Drawing Sheets

(56) References Cited

U.S. PATENT DOCUMENTS

2018/0018133 A1* 1/2018 Balakrishnan ........ G06F 3/0659
2019/0196995 A1* 6/2019 Shen .................... G06F 3/0673

OTHER PUBLICATIONS

"DDR4 SDRAM—Understanding Timing Parameters;" Feb. 6, 2018; available at: https://www.systemverilog.io/understanding-ddr4-timing-parameters (Year: 2018).*
International Search Report and Written Opinion for International Application No. PCT/US2022/020388, dated Jul. 4, 2022, 7 pages.

* cited by examiner

DRAM COMMAND STREAK EFFICIENCY MANAGEMENT

BACKGROUND

Computer systems typically use inexpensive and high density dynamic random access memory (DRAM) chips for main memory. Most DRAM chips sold today are compatible with various double data rate (DDR) DRAM standards promulgated by the Joint Electron Devices Engineering Council (JEDEC). DDR DRAMs use conventional DRAM memory cell arrays with high-speed access circuits to achieve high transfer rates and to improve the utilization of the memory bus.

A typical DDR memory controller maintains a queue to store pending read and write requests to allow the memory controller to pick the pending requests out of order and thereby to increase efficiency. For example, the memory controller can retrieve multiple memory access requests to the same row in a given rank of memory (referred to as "page hits") from the queue out of order and issue them consecutively to the memory system to avoid the overhead of precharging the current row and activating another row repeatedly. However, scanning and picking accesses from a deep queue while taking advantage of the bus bandwidth available with modern memory technologies such as DDR5 has become difficult to achieve with known memory controllers. Memory controllers may employ techniques such as creating streaks of read commands or write commands to improve bus efficiency. However, such techniques come with performance trade-offs, such as latency concerns that arise from delaying commands not part of the current streak, and additional performance overhead associated with "turning around" the command bus from a read streak to a write streak, and vice versa.

Figure 1:
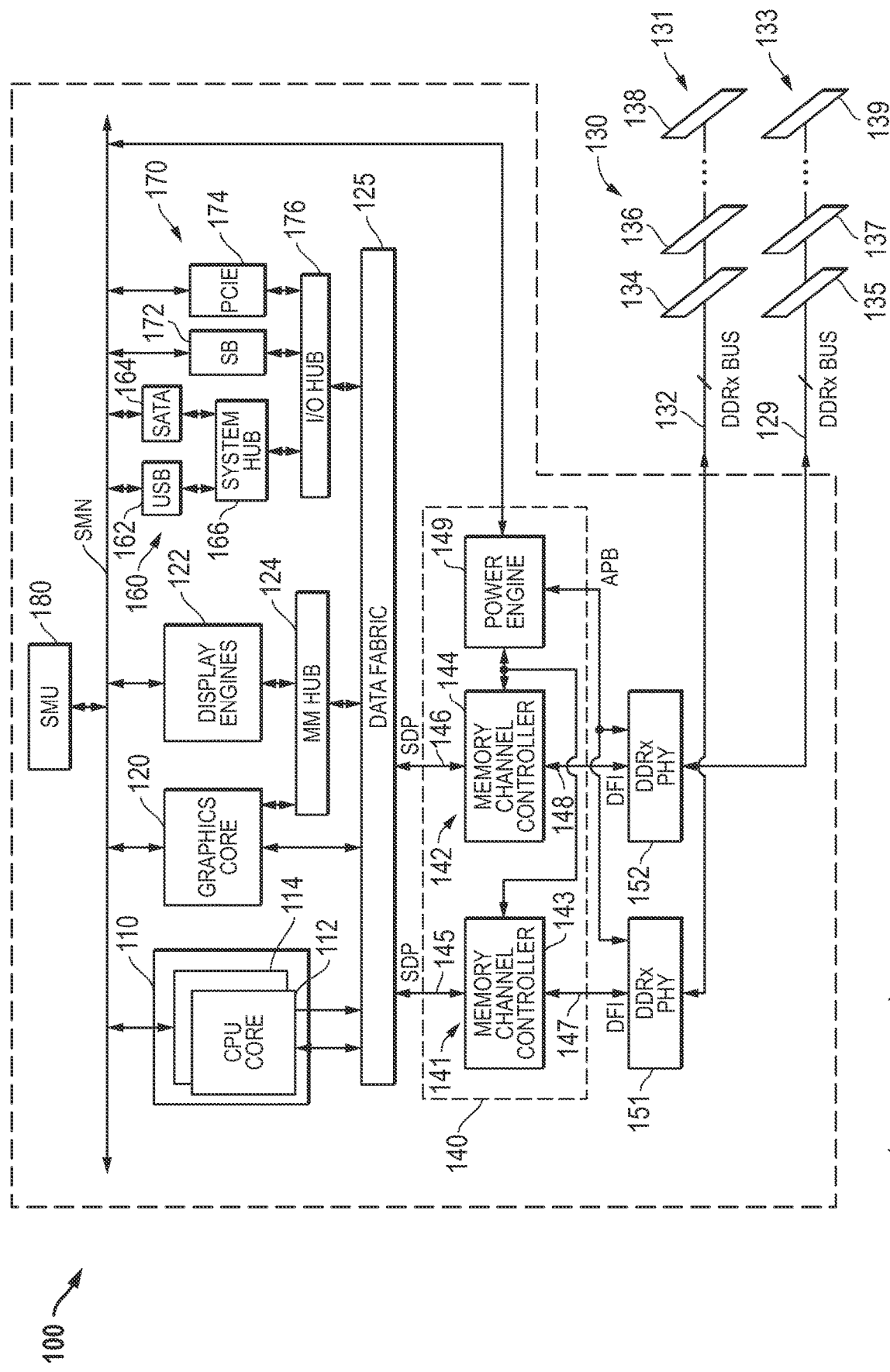
FIG. 1 illustrates in block diagram form an accelerated processing unit (APU) and memory system known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A memory controller includes a command queue having a first input for receiving memory access requests, and a memory interface queue having an output for coupling to a memory channel adapted for connecting to at least one dynamic random access memory (DRAM). An arbiter is connected to the command queue for selecting entries from the command queue, and placing them in the memory interface queue causing them to be transmitted over the memory channel. The arbiter is operable to transact streaks of consecutive read commands and streaks of consecutive write commands over the memory channel. The arbiter is operable to transact a streak for at least a minimum burst length based on a number of commands of a designated type available to be selected by the arbiter. Following the minimum burst length, the arbiter is operable to decide to start a new streak of commands of a different type based on a first set of one or more conditions indicating intra-burst efficiency.

A method includes causing streaks of consecutive read commands and streaks of consecutive write commands to be transacted over a memory channel. The method includes transacting a streak for at least a minimum burst length based on a number of commands of a designated type available to be selected by the arbiter. Following the minimum burst length, the method includes deciding to start a new streak of commands of a different type based on a first set of one or more conditions indicating intra-burst efficiency.

A data processing system includes a central processing unit, a data fabric connected to the central processing unit, and a memory controller connected to the data fabric for fulfilling memory requests from the central processing unit. The memory controller includes a command queue having a first input for receiving memory access requests, and a memory interface queue having an output for coupling to a memory channel adapted for connecting to at least one DRAM. An arbiter is connected to the command queue for selecting entries from the command queue, and placing them in the memory interface queue causing them to be transmitted over the memory channel. The arbiter is operable to transact streaks of consecutive read commands and streaks of consecutive write commands over the memory channel. The arbiter is operable to transact a streak for at least a minimum burst length based on a number of commands of a designated type available to be selected by the arbiter. Following the minimum burst length, the arbiter is operable to decide to start a new streak of commands of a different type based on a first set of one or more conditions indicating intra-burst efficiency.

FIG. 1 illustrates in block diagram form an accelerated processing unit (APU) 100 and memory system 130 known in the prior art. APU 100 is an integrated circuit suitable for use as a processor in a host data processing system, and includes generally a central processing unit (CPU) core complex 110, a graphics core 120, a set of display engines 122, a memory management hub 140, a data fabric 125, a set of peripheral controllers 160, a set of peripheral bus controllers 170, and a system management unit (SMU) 180.

CPU core complex 110 includes a CPU core 112 and a CPU core 114. In this example, CPU core complex 110 includes two CPU cores, but in other embodiments CPU core complex 110 can include an arbitrary number of CPU cores. Each of CPU cores 112 and 114 is bidirectionally connected to a system management network (SMN), which forms a control fabric, and to data fabric 125, and is capable of providing memory access requests to data fabric 125. Each of CPU cores 112 and 114 may be unitary cores, or may further be a core complex with two or more unitary cores sharing certain resources such as caches.

Graphics core 120 is a high performance graphics processing unit (GPU) capable of performing graphics operations such as vertex processing, fragment processing, shading, texture blending, and the like in a highly integrated and parallel fashion. Graphics core 120 is bidirectionally connected to the SMN and to data fabric 125, and is capable of providing memory access requests to data fabric 125. In this regard, APU 100 may either support a unified memory architecture in which CPU core complex 110 and graphics core 120 share the same memory space, or a memory architecture in which CPU core complex 110 and graphics core 120 share a portion of the memory space, while graphics core 120 also uses a private graphics memory not accessible by CPU core complex 110.

Display engines 122 render and rasterize objects generated by graphics core 120 for display on a monitor. Graphics core 120 and display engines 122 are bidirectionally connected to a common memory management hub 140 for uniform translation into appropriate addresses in memory system 130, and memory management hub 140 is bidirectionally connected to data fabric 125 for generating such memory accesses and receiving read data returned from the memory system.

Data fabric 125 includes a crossbar switch for routing memory access requests and memory responses between any memory accessing agent and memory management hub 140. It also includes a system memory map, defined by basic input/output system (BIOS), for determining destinations of memory accesses based on the system configuration, as well as buffers for each virtual connection.

Peripheral controllers 160 include a universal serial bus (USB) controller 162 and a Serial Advanced Technology Attachment (SATA) interface controller 164, each of which is bidirectionally connected to a system hub 166 and to the SMN bus. These two controllers are merely exemplary of peripheral controllers that may be used in APU 100.

Peripheral bus controllers 170 include a system controller or "Southbridge" (SB) 172 and a Peripheral Component Interconnect Express (PCIe) controller 174, each of which is bidirectionally connected to an input/output (I/O) hub 176 and to the SMN bus. I/O hub 176 is also bidirectionally connected to system hub 166 and to data fabric 125. Thus for example a CPU core can program registers in USB controller 162, SATA interface controller 164, SB 172, or PCIe controller 174 through accesses that data fabric 125 routes through I/O hub 176. Software and firmware for APU 100 are stored in a system data drive or system BIOS memory (not shown) which can be any of a variety of non-volatile memory types, such as read-only memory (ROM), flash electrically erasable programmable ROM (EEPROM), and the like. Typically, the BIOS memory is accessed through the PCIe bus, and the system data drive through the SATA interface.

SMU 180 is a local controller that controls the operation of the resources on APU 100 and synchronizes communication among them. SMU 180 manages power-up sequencing of the various processors on APU 100 and controls multiple off-chip devices via reset, enable and other signals. SMU 180 includes one or more clock sources (not shown), such as a phase locked loop (PLL), to provide clock signals for each of the components of APU 100. SMU 180 also manages power for the various processors and other functional blocks, and may receive measured power consumption values from CPU cores 112 and 114 and graphics core 120 to determine appropriate power states.

Memory management hub 140 and its associated physical interfaces (PHYs) 151 and 152 are integrated with APU 100 in this embodiment. Memory management hub 140 includes memory channels 141 and 142 and a power engine 149. Memory channel 141 includes a host interface 145, a memory channel controller 143, and a physical interface 147. Host interface 145 bidirectionally connects memory channel controller 143 to data fabric 125 over a serial presence detect link (SDP). Physical interface 147 bidirectionally connects memory channel controller 143 to PHY 151, and in the exemplary embodiment conforms to the DDR PHY Interface (DFI) Specification. Memory channel 142 includes a host interface 146, a memory channel controller 144, and a physical interface 148. Host interface 146 bidirectionally connects memory channel controller 144 to data fabric 125 over another SDP. Physical interface 148 bidirectionally connects memory channel controller 144 to PHY 152, and conforms to the DFI Specification. Power engine 149 is bidirectionally connected to SMU 180 over the SMN bus, to PHYs 151 and 152 over the APB, and is also bidirectionally connected to memory channel controllers 143 and 144. PHY 151 has a bidirectional connection to memory channel 131. PHY 152 has a bidirectional connection memory channel 133.

Memory management hub 140 is an instantiation of a memory controller having two memory channel controllers and uses a shared power engine 149 to control operation of both memory channel controller 143 and memory channel controller 144 in a manner that will be described further below. Each of memory channels 141 and 142 can connect to state-of-the-art DDR memories such as DDR version five (DDR5), DDR version four (DDR4), low power DDR4 (LPDDR4), graphics DDR version five (GDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring.

Memory system 130 includes a memory channel 131 and a memory channel 133. Memory channel 131 includes a set of dual inline memory modules (DIMMs) connected to a DDRx bus 132, including representative DIMMs 134, 136, and 138 that in this example correspond to separate ranks. Likewise, memory channel 133 includes a set of DIMMs connected to a DDRx bus 129, including representative DIMMs 135, 137, and 139.

APU 100 operates as the central processing unit (CPU) of a host data processing system and provides various buses and interfaces useful in modern computer systems. These interfaces include two double data rate (DDRx) memory channels, a PCIe root complex for connection to a PCIe link, a USB controller for connection to a USB network, and an interface to a SATA mass storage device.

APU 100 also implements various system monitoring and power saving functions. In particular one system monitoring function is thermal monitoring. For example, if APU 100 becomes hot, then SMU 180 can reduce the frequency and voltage of CPU cores 112 and 114 and/or graphics core 120. If APU 100 becomes too hot, then it can be shut down entirely. Thermal events can also be received from external sensors by SMU 180 via the SMN bus, and SMU 180 can reduce the clock frequency and/or power supply voltage in response.

Figure 2:
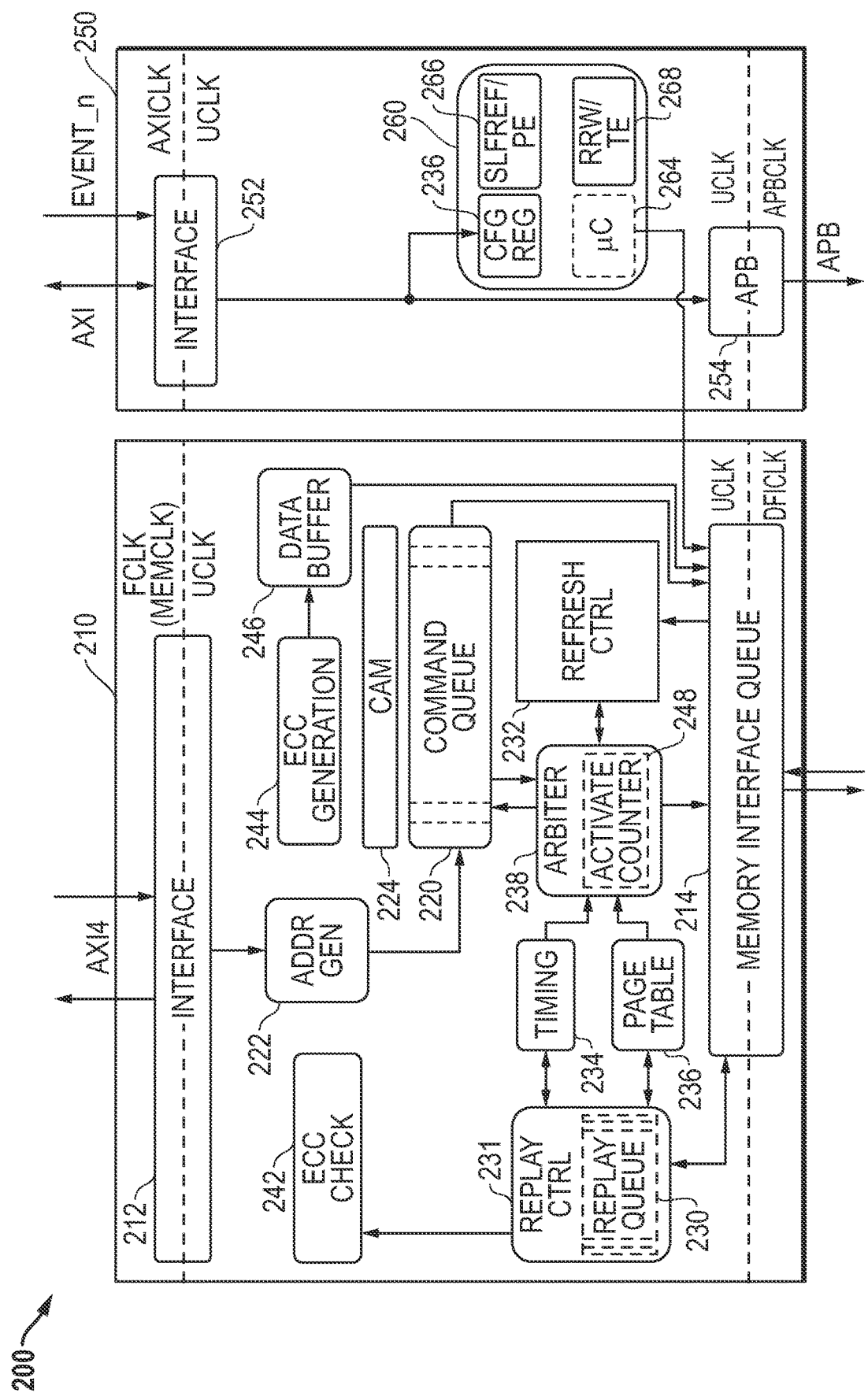
FIG. 2 illustrates in block diagram form a memory controller suitable for use in an APU like that of FIG. 1 according to some embodiments.

FIG. 2 illustrates in block diagram form a memory controller 200 that is suitable for use in an APU like that of FIG. 1. Memory controller 200 includes generally a memory channel controller 210 and a power controller 250. Memory channel controller 210 includes generally an interface 212, a memory interface queue 214, a command queue 220, an address generator 222, a content addressable memory (CAM) 224, replay control logic 231 including a replay queue 230, a refresh control logic block 232, a timing block 234, a page table 236, an arbiter 238, an error correction code (ECC) check circuit 242, an ECC generation block 244, a data buffer 246, and refresh logic 247.

Interface 212 has a first bidirectional connection to data fabric 125 over an external bus, and has an output. In memory controller 200, this external bus is compatible with the advanced extensible interface version four specified by ARM Holdings, PLC of Cambridge, England, known as "AXI4", but can be other types of interfaces in other embodiments. Interface 212 translates memory access requests from a first clock domain known as the FCLK (or MEMCLK) domain to a second clock domain internal to memory controller 200 known as the UCLK domain. Similarly, memory interface queue 214 provides memory accesses from the UCLK domain to a DFICLK domain associated with the DFI interface.

Address generator 222 decodes addresses of memory access requests received from data fabric 125 over the AXI4 bus. The memory access requests include access addresses in the physical address space represented in a normalized format. Address generator 222 converts the normalized addresses into a format that can be used to address the actual memory devices in memory system 130, as well as to efficiently schedule related accesses. This format includes a region identifier that associates the memory access request with a particular rank, a row address, a column address, a bank address, and a bank group. On startup, the system BIOS queries the memory devices in memory system 130 to determine their size and configuration, and programs a set of configuration registers associated with address generator 222. Address generator 222 uses the configuration stored in the configuration registers to translate the normalized addresses into the appropriate format. Command queue 220 is a queue of memory access requests received from the memory accessing agents in APU 100, such as CPU cores 112 and 114 and graphics core 120. Command queue 220 stores the address fields decoded by address generator 222 as well other address information that allows arbiter 238 to select memory accesses efficiently, including access type and quality of service (QoS) identifiers. CAM 224 includes information to enforce ordering rules, such as write after write (WAW) and read after write (RAW) ordering rules.

Error correction code (ECC) generation block 244 determines the ECC of write data to be sent to the memory. ECC check circuit 242 checks the received ECC against the incoming ECC.

Replay queue 230 is a temporary queue for storing selected memory accesses picked by arbiter 238 that are awaiting responses, such as address and command parity responses. Replay control logic 231 accesses ECC check circuit 242 to determine whether the returned ECC is correct or indicates an error. Replay control logic 231 initiates and controls a replay sequence in which accesses are replayed in the case of a parity or ECC error of one of these cycles. Replayed commands are placed in the memory interface queue 214.

Refresh control logic 232 includes state machines for various powerdown, refresh, and termination resistance (ZQ) calibration cycles that are generated separately from normal read and write memory access requests received from memory accessing agents. For example, if a memory rank is in precharge powerdown, it must be periodically awakened to run refresh cycles. Refresh control logic 232 generates refresh commands periodically and in response to designated conditions to prevent data errors caused by leaking of charge off storage capacitors of memory cells in DRAM chips. Refresh control logic 232 includes an activate counter 248, which in this embodiment has a counter for each memory region which counts a rolling number of activate commands sent over the memory channel to a memory region. The memory regions are memory banks in some embodiments, and memory sub-banks in other embodiments as further discussed below. In addition, refresh control logic 232 periodically calibrates ZQ to prevent mismatch in on-die termination resistance due to thermal changes in the system.

Arbiter 238 is bidirectionally connected to command queue 220 and is the heart of memory channel controller 210, and improves efficiency by intelligent scheduling of accesses to improve the usage of the memory bus. Arbiter 238 uses timing block 234 to enforce proper timing relationships by determining whether certain accesses in command queue 220 are eligible for issuance based on DRAM timing parameters. For example, each DRAM has a minimum specified time between activate commands, known as "$t_{RC}$". Timing block 234 maintains a set of counters that determine eligibility based on this and other timing parameters specified in the JEDEC specification, and is bidirectionally connected to replay queue 230. Page table 236 maintains state information about active pages in each bank and rank of the memory channel for arbiter 238, and is bidirectionally connected to replay queue 230.

In response to write memory access requests received from interface 212, ECC generation block 244 computes an ECC according to the write data. Data buffer 246 stores the write data and ECC for received memory access requests. It outputs the combined write data/ECC to memory interface queue 214 when arbiter 238 picks the corresponding write access for dispatch to the memory channel.

Power controller 250 generally includes an interface 252 to an advanced extensible interface, version one (AXI), an advanced peripheral bus (APB) interface 254, and a power engine 260. Interface 252 has a first bidirectional connection to the SMN, which includes an input for receiving an event signal labeled "EVENT_n" shown separately in FIG. 2, and an output. APB interface 254 has an input connected to the output of interface 252, and an output for connection to a PHY over an APB. Power engine 260 has an input connected to the output of interface 252, and an output connected to an input of memory interface queue 214. Power engine 260 includes a set of configuration registers 262, a microcontroller (μC) 264, a self refresh controller (SLFREF/PE) 266, and a reliable read/write timing engine (RRW/TE) 268. Configuration registers 262 are programmed over the AXI bus, and store configuration information to control the operation of various blocks in memory controller 200. Accordingly, configuration registers 262 have outputs connected to these blocks that are not shown in detail in FIG. 2. SLFREF/PE 266 is an engine that allows the manual generation of refreshes in addition to the automatic generation of refreshes by refresh control logic 232. Reliable read/write timing engine 268 provides a continuous memory access stream to memory or I/O devices for such purposes as DDR interface maximum read latency (MRL) training and loopback testing.

Memory channel controller 210 includes circuitry that allows it to pick memory accesses for dispatch to the associated memory channel. In order to make the desired arbitration decisions, address generator 222 decodes the address information into predecoded information including rank, row address, column address, bank address, and bank group in the memory system, and command queue 220 stores the predecoded information. Configuration registers 262 store configuration information to determine how address generator 222 decodes the received address information. Arbiter 238 uses the decoded address information, timing eligibility information indicated by timing block 234, and active page information indicated by page table 236 to efficiently schedule memory accesses while observing other criteria such as quality of service (QoS) requirements. For example, arbiter 238 implements a preference for accesses to open pages to avoid the overhead of precharge and activation commands required to change memory pages, and hides overhead accesses to one bank by interleaving them with read and write accesses to another bank. In particular during normal operation, arbiter 238 normally keeps pages open in different banks until they are required to be precharged prior to selecting a different page. Arbiter 238, in some embodiments, determines eligibility for command selection based on at least on respective values of activate counter 248 for target memory regions of the respective commands.

Figure 3:
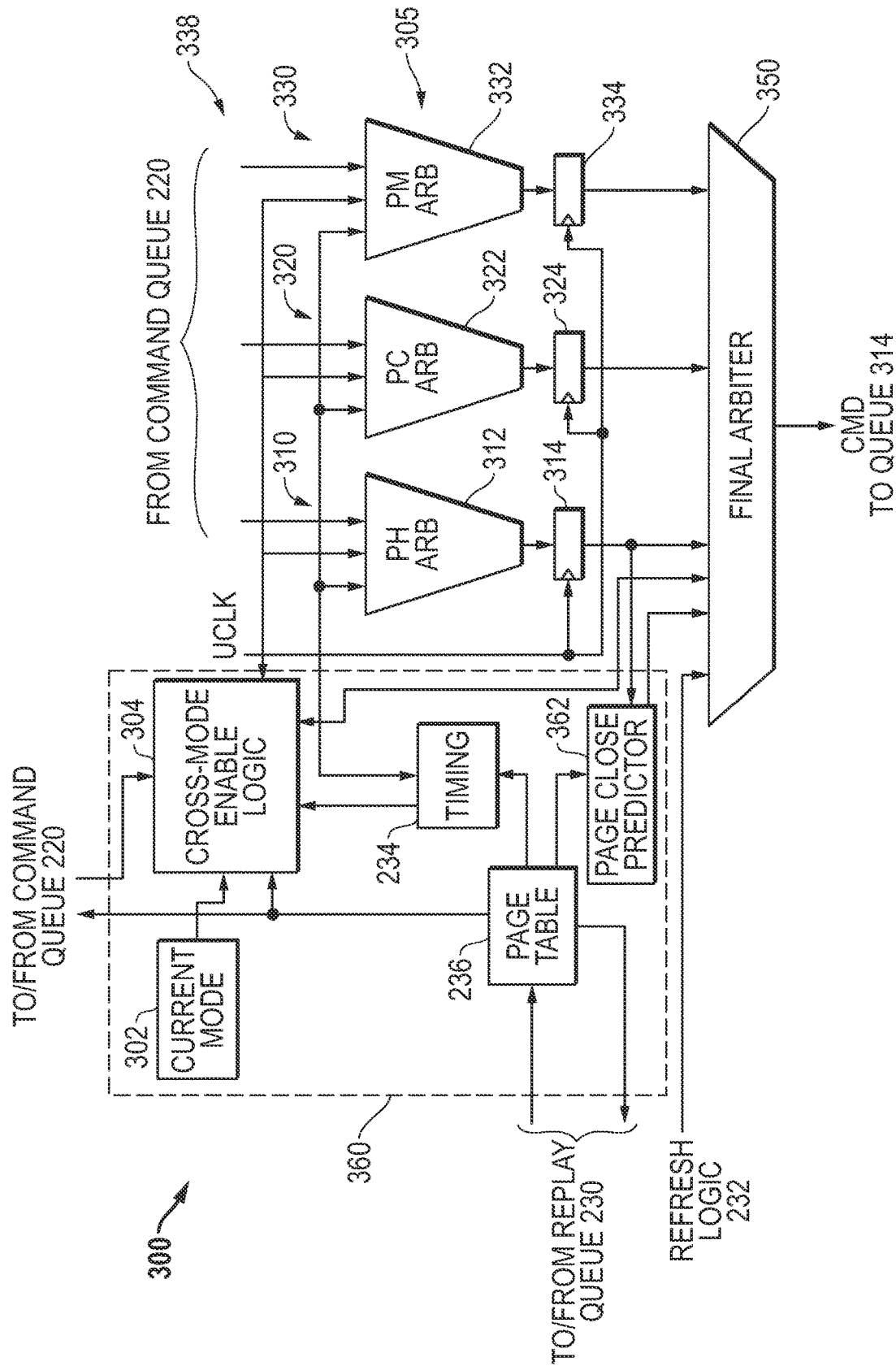
FIG. 3 illustrates a block diagram of a portion of the memory controller of FIG. 2 according to some embodiments.

FIG. 3 illustrates a block diagram of a portion 300 of memory controller 200 of FIG. 2 according to some embodiments. Portion 300 includes arbiter 238 and a set of control circuits 360 associated with the operation of arbiter 238. Arbiter 238 includes a set of sub-arbiters 305 and a final arbiter 350. Sub-arbiters 305 include a sub-arbiter 310, a sub-arbiter 320, and a sub-arbiter 330. Sub-arbiter 310 includes a page hit arbiter 312 labeled "PH ARB", and an output register 314. Page hit arbiter 312 has a first input connected to command queue 220, a second input, and an output. Register 314 has a data input connected to the output of page hit arbiter 312, a clock input for receiving the UCLK signal, and an output. Sub-arbiter 320 includes a page conflict arbiter 322 labeled "PC ARB", and an output register 324. Page conflict arbiter 322 has a first input connected to command queue 220, a second input, and an output. Register 324 has a data input connected to the output of page conflict arbiter 322, a clock input for receiving the UCLK signal, and an output. Sub-arbiter 330 includes a page miss arbiter 332 labeled "PM ARB", and an output register 334. Page miss arbiter 332 has a first input connected to command queue 220, a second input, and an output. Register 334 has a data input connected to the output of page miss arbiter 332, a clock input for receiving the UCLK signal, and an output. Final arbiter 350 has a first input connected to the output of refresh control logic 232, a second input from a page close predictor 362, a third input connected to the output of output register 314, a fourth input connected to the output of output register 324, a fifth input connected to the output of output register 334, a first output for providing a first arbitration winner to queue 214 labeled "CMD1", and a second output for providing a second arbitration winner to queue 214 labeled "CMD2".

Control circuits 360 include timing block 234 and page table 236 as previously described with respect to FIG. 2, and a page close predictor 362, a current mode register 302, and cross-mode enable logic 304. Timing block 234 has an output connected to cross-mode enable logic 304, an input and an output connected to page hit arbiter 312, page conflict arbiter 322, and page miss arbiter 332. Page table 234 has an input connected to an output of replay queue 230, an output connected to an input of replay queue 230, an output connected to the input of command queue 220, an output connected to the input of timing block 234, and an output connected to the input of page close predictor 362. Page close predictor 362 has an input connected to one output of page table 236, an input connected to the output of output register 314, and an output connected to the second input of final arbiter 350. Cross-mode enable logic 304 has an input connected to current mode register 302, and input connected to command queue 220, an input and output connected to final arbiter 350, and an input and output connected to page hit arbiter 310, page conflict arbiter 320, and page miss arbiter 330.

In operation, arbiter 238 selects memory access commands from command queue 220 and refresh control logic 232 by taking into account the current mode (indicating whether a read streak or write streak is in progress), the page status of each entry, the priority of each memory access request, and the dependencies between requests. The priority is related to the quality of service or QoS of requests received from the AXI4 bus and stored in command queue 220, but can be altered based on the type of memory access and the dynamic operation of arbiter 238. Arbiter 238 includes three sub-arbiters that operate in parallel to address the mismatch between the processing and transmission limits of existing integrated circuit technology. The winners of the respective sub-arbitrations are presented to final arbiter 350. Final arbiter 350 selects between these three sub-arbitration winners as well as a refresh operation from refresh control logic 232, and may further modify a read or write command into a read or write with auto-precharge command as determined by page close predictor 362.

Cross-mode enable logic 304 operates to cause streaks of read commands and streaks of write commands over the memory channel. During a current streak of either type of commands, cross-mode enable logic 304 monitors an indicator of data bus efficiency of the memory channel as further described below with respect to FIG. 4 and FIG. 5. In response to the indicator of data bus efficiency indicating that data bus efficiency is less than a designated threshold, cross-mode enable logic 304 stops the current streak, starts a streak of the other type, and changes the current mode in current mode register 302.

Each of page hit arbiter 312, page conflict arbiter 322, and page miss arbiter 332 has an input connected to the output of timing block 234 to determine timing eligibility of commands in command queue 220 that fall into these respective categories. Timing block 234 includes an array of binary counters that count durations related to the particular operations for each bank in each rank. The number of timers needed to determine the status depends on the timing parameter, the number of banks for the given memory type, and the number of ranks supported by the system on a given memory channel. The number of timing parameters that are implemented in turn depends on the type of memory implemented in the system. For example, GDDR5 memories require more timers to comply with more timing parameters than other DDRx memory types. By including an array of generic timers implemented as binary counters, timing block 234 can be scaled and reused for different memory types. The inputs from cross-mode enable logic 304 signal the sub-arbiters which type of commands, read or write, to provide as candidates for final arbiter 350.

A page hit is a read or write cycle to an open page. Page hit arbiter 312 arbitrates between accesses in command queue 220 to open pages. The timing eligibility parameters tracked by timers in timing block 234 and checked by page hit arbiter 312 include, for example, row address strobe (RAS) to column address strobe (CAS) delay time ($t_{RCD}$) and CAS latency ($t_{CL}$). For example, $t_{RCD}$ specifies the minimum amount of time that must elapse before a read or write access to a page after it has been opened in a RAS cycle. Page hit arbiter 312 selects a sub-arbitration winner based on the assigned priority of the accesses. In one embodiment, the priority is a 4-bit, one-hot value that therefore indicates a priority among four values, however it should be apparent that this four-level priority scheme is just one example. If page hit arbiter 312 detects two or more requests at the same priority level, then the oldest entry wins.

A page conflict is an access to one row in a bank when another row in the bank is currently activated. Page conflict arbiter 322 arbitrates between accesses in command queue 220 to pages that conflict with the page that is currently open in the corresponding bank and rank. Page conflict arbiter 322 selects a sub-arbitration winner that causes the issuance of a precharge command. The timing eligibility parameters tracked by timers in timing block 234 and checked by page conflict arbiter 322 include, for example, active to precharge command period ($t_{RAS}$). Page conflict arbiter 322 selects a sub-arbitration winner based on the assigned priority of the access. If page conflict arbiter 322 detects two or more requests at the same priority level, then the oldest entry wins.

A page miss is an access to a bank that is in the precharged state. Page miss arbiter 332 arbitrates between accesses in command queue 220 to precharged memory banks. The timing eligibility parameters tracked by timers in timing block 234 and checked by page miss arbiter 332 include, for example, precharge command period ($t_{RP}$). If there are two or more requests that are page misses at the same priority level, then the oldest entry wins.

Each sub-arbiter outputs a priority value for their respective sub-arbitration winner. Final arbiter 350 compares the priority values of the sub-arbitration winners from each of page hit arbiter 312, page conflict arbiter 322, and page miss arbiter 332. Final arbiter 350 determines the relative priority among the sub-arbitration winners by performing a set of relative priority comparisons taking into account two sub-arbitration winners at a time. The sub-arbiters may include a set of logic for arbitrating commands for each mode, read and write, so that when the current mode changes, a set of available candidate commands are quickly available as sub-arbitration winners.

After determining the relative priority among the three sub-arbitration winners, final arbiter 350 then determines whether the sub-arbitration winners conflict (i.e. whether they are directed to the same bank and rank). When there are no such conflicts, then final arbiter 350 selects up to two sub-arbitration winners with the highest priorities. When there are conflicts, then final arbiter 350 complies with the following rules. When the priority value of the sub-arbitration winner of page hit arbiter 312 is higher than that of page conflict arbiter 322, and they are both to the same bank and rank, then final arbiter 350 selects the access indicated by page hit arbiter 312. When the priority value of the sub-arbitration winner of page conflict arbiter 322 is higher than that of page hit arbiter 312, and they are both to the same bank and rank, final arbiter 350 selects the winner based on several additional factors. In some cases, page close predictor 362 causes the page to close at the end of the access indicated by page hit arbiter 312 by setting the auto precharge attribute.

Within page hit arbiter 312, priority is initially set by the request priority from the memory accessing agent but is adjusted dynamically based on the type of accesses (read or write) and the sequence of accesses. In general, page hit arbiter 312 assigns a higher implicit priority to reads, but implements a priority elevation mechanism to ensure that writes make progress toward completion.

Whenever page hit arbiter 312 selects a read or write command, page close predictor 362 determines whether to send the command with the auto-precharge (AP) attribute or not. During a read or write cycle, the auto-precharge attribute is set with a predefined address bit and the auto-precharge attribute causes the DDR device to close the page after the read or write cycle is complete, which avoids the need for the memory controller to later send a separate precharge command for that bank. Page close predictor 362 takes into account other requests already present in command queue 220 that access the same bank as the selected command. If page close predictor 362 converts a memory access into an AP command, the next access to that page will be a page miss.

By using different sub-arbiters for different memory access types, each arbiter can be implemented with simpler logic than if it were required to arbitrate between all access types (page hits, page misses, and page conflicts; although embodiments including a single arbiter are envisioned). Thus the arbitration logic can be simplified and the size of arbiter 238 can be kept relatively small.

In other embodiments, arbiter 238 could include a different number of sub-arbiters. In yet other embodiments, arbiter 238 could include two or more sub-arbiters of a particular type. For example, arbiter 238 could include two or more page hit arbiters, two or more page conflict arbiters, and/or two or more page miss arbiters.

Figure 4:
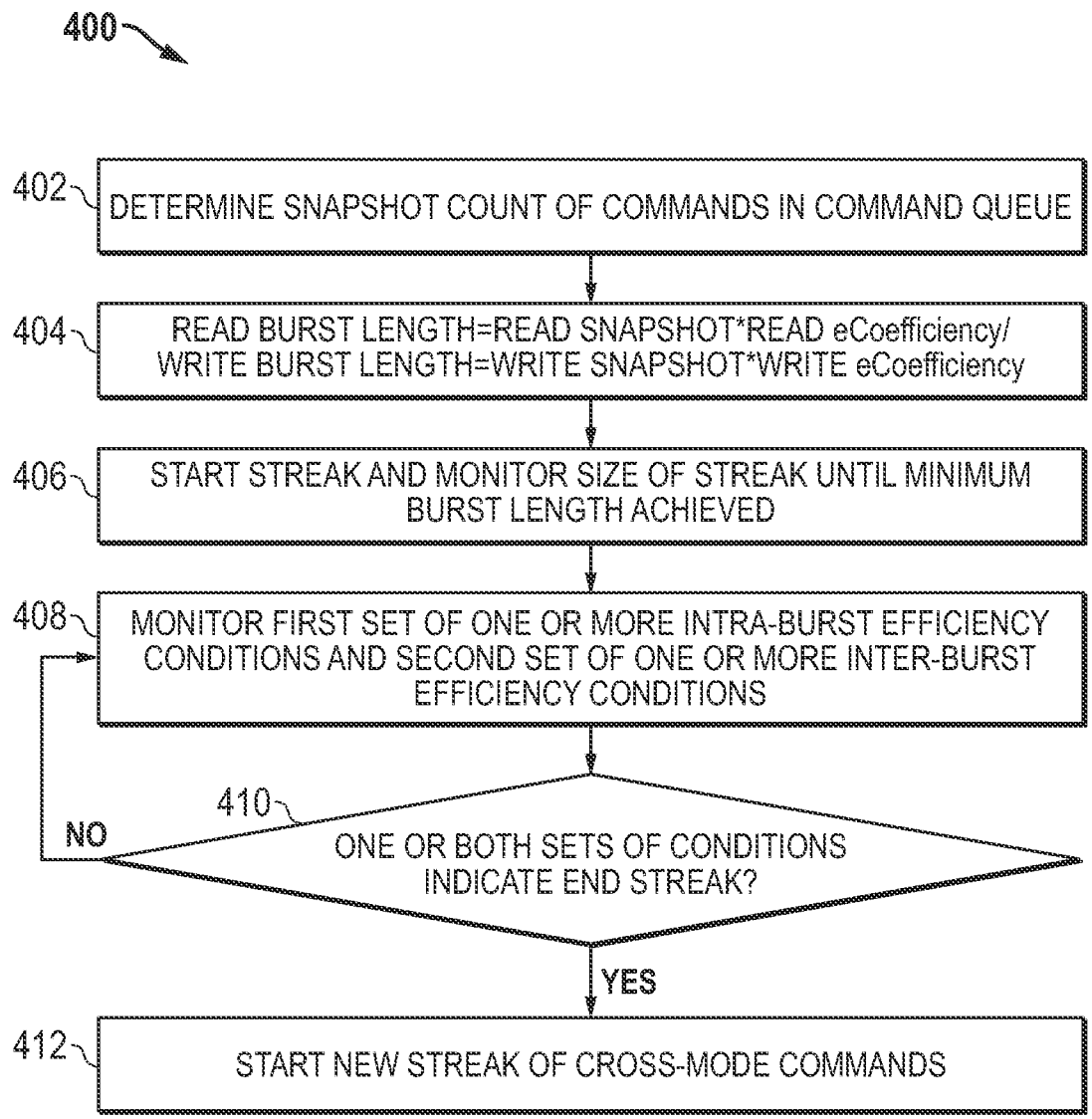
FIG. 4 is a flow diagram of a process for managing streak efficiency according to some embodiments.

FIG. 4 is a flow diagram 400 of a process for managing streak efficiency according to some embodiments. In some versions, the process is embodied in monitoring logic circuitry inside the memory controller's arbiter (such as arbiter 238, FIG. 2). In other versions, the process may be performed by digital logic or a controller having similar functionality while using different methods of arbitration than the sub-arbiters 305 and final arbiter 350 described above. The process generally works to decide when to perform a turnaround of the streak of commands, changing the current mode to read from write, or to write from read, to improve data bus utilization efficiency. The process may be used in combination with other techniques of determining the length of a streak of read or write commands.

The process starts at block 402, at the beginning of each streak of commands, and determines snapshot or count of the commands currently in the command queue for the mode of commands (read or write) which will be burst in the streak. In some embodiments, this snapshot count is tracked by the streak turnaround process and is available at the beginning of a new streak. In some embodiments, the process updates the snapshot count to account for any new commands that have entered the command queue after the decision was made to end the prior streak.

At block 404, the process determines the minimum burst length, the minimum number of commands to be sent in the streak, based on the snapshot of the number of commands from block 402. Thus, the minimum burst length is adaptive to the current conditions at the memory controller. In this embodiment, the minimum burst length is calculated by scaling or multiplying the snapshot by a predetermined coefficient provided to the arbiter. A first coefficient "READ eCoefficiency" is used for read streaks, and a second coefficient "WRITE eCoefficiency" is used for write streaks, as shown at block 404. In some embodiments, the snapshot is adjusted to account for commands of the new current mode available to be selected by the arbiter that are not "blocked", that is, do not become page conflicts due to a cross-mode activation. This adjustment is made by setting the minimum burst length equal to the lower of the scaled snapshot number and the total number of new current-mode requests not blocked by a cross-mode activation. This adjustment is made due to the scenario that at a streak turnaround, cross-mode requests become page hits and same bank current-mode requests become page conflicts. The process does not include these current-mode page conflicts conflicting with cross-mode hits in the count of commands available to be scheduled for the new streak, otherwise the minimum streak length would counteract the benefit of cross-mode ACTs due to the cross-mode activation.

At block 406, the process starts sending commands for the streak, and monitors the size of the streak (the number of commands sent in the streak) until the minimum burst length set at block 404 is achieved.

Blocks 408 and 410 are performed for each command sent after the minimum burst length is achieved. At block 408, following the minimum burst length, the process monitors a first set of one or more conditions indicating intra-burst efficiency, as further described below. In this embodiment, a second set of conditions indicating inter-burst efficiency is also monitored at block 408. In some other embodiments, efficiency conditions are monitored only for intra-burst efficiency following the minimum burst length. Monitoring the set(s) of conditions in some embodiments include calculating one or more indicators such as bus usage efficiency or CAS latency. Monitoring the efficiency conditions may also include monitoring conditions at the memory controller such as the available current-mode or cross-mode commands. An exemplary embodiment using multiple CAS latency conditions is described below with respect to FIG. 5.

At block 410, the process decides whether to end the streak based on whether the monitored conditions indicate that ending the streak and starting a new streak of the other mode will be more efficient. In some embodiments, at least the first set of conditions (intra-burst efficiency) is employed to make the decision at block 410. In other embodiments, a combination of the first and second sets of conditions are employed. The first and second sets of conditions may each include one or more conditions in various embodiments. If the process does not decide to end the streak at block 410, it returns to block 408 to continue monitoring the streak as new commands are sent. If the process decides to end the streak at block 410, it goes to block 412 where it changes the current mode and starts a new streak of commands of the type of commands that were cross-mode commands in the prior streak. To determine if the set(s) of conditions indicate a streak end, one or more conditions are compared to thresholds, or may be compared to each other. In some embodiments, the second set of conditions related to inter-burst efficiency is compared to a threshold that is based on at least partially on the time it takes to turnaround the process to start a new streak.

Generally, the depicted process has several advantages over other known streak management processes that make it suitable for managing a wide variety of memory access workloads. It also solves several problems that tend to occur with various streak management techniques. For example, the use of intra-burst efficiency management alone tends to cause excessive turnover of streaks because the intra-burst management will frequently decide to end a streak when there is not an efficient set of commands to burst for the cross-mode streak. Especially for workloads with poor bank level parallelism, such excessive turnover hurts overall efficiency. While the use of a minimum threshold may seem to mitigate such a problem, it has associated problems. If the minimum threshold is too large, a burst can become inefficient even before reaching minimum threshold. If the minimum burst length is too low, there will be more turnarounds. Minimum burst threshold is also workload dependent, meaning a threshold selected for one type of workload might not be suitable for another type of workload.

While the use of an adaptive minimum burst length alone tends to improve inter-burst efficiency, it does not provide sufficient management of the many different situations and workloads with which intra-burst efficiency can suffer. For example, the bursts may not continue long enough to achieve a high level of efficiency for a particular workload. The depicted process addresses this issue by combining intra-burst efficiency management with an adaptive minimum burst length.

Figure 5:
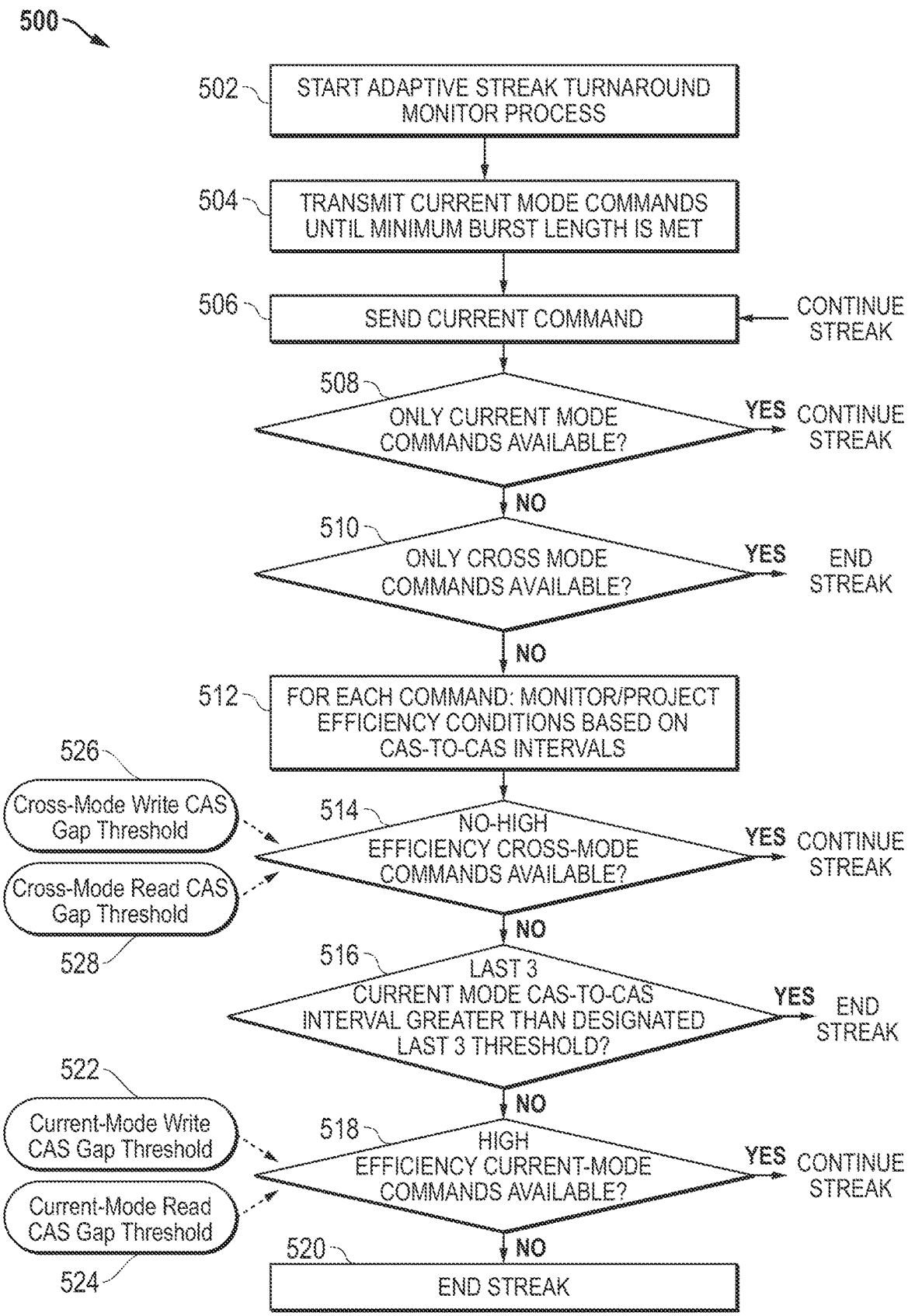
FIG. 5 is a flow diagram of another process for managing streak efficiency according to some additional embodiments.

FIG. 5 is a flow diagram 500 of a process for managing streak efficiency according to some additional embodiments. The process is typically performed by monitoring logic inside the memory controller's arbiter (such as arbiter 238, FIG. 2) to transact streaks of consecutive read commands and streaks of consecutive write commands sent to the system memory. The depicted process is an exemplary implementation of the process of FIG. 4, and generally employs intervals between two or more adjacent CAS commands as intra-burst efficiency indicators, and also employs other CAS intervals as inter-burst efficiency indicators.

When a new streak begins, block 502 the turnaround monitor process is started. An adaptive minimum burst length is determined as described above with respect to FIG. 4. At block 504, the initial commands of the streak are sent over the command bus until the minimum burst length is met.

After the minimum burst length is met, the process performs several checks for each command sent in the streak to determine if the streak should end or continue. At block 506, the current command is sent. At block 508, the process determines whether only current mode commands are available to be sent at the arbiter. For example, if the current streak is a write streak, block 508 determines whether only write commands are pending. If so, the process continues the streak, returning to block 506 to send the next command. If not, the process goes to block 510, where it determines if only cross-mode commands are available at the arbiter. If so, the process ends the current streak and begins a new streak.

At block 510, if there are still current mode commands available, the process continues to block 512, where it monitors intra-burst efficiency for each command based on the interval between CAS commands, referred to as "CAS-to-CAS" interval. In some embodiments, the interval is determined for multiple candidate commands at the arbiter. The interval is a measurement or projection of one or more time intervals between column-address-strobe (CAS) commands. The interval includes a time interval between a most recently transmitted CAS command and a time at which a selected subsequent CAS command can be transmitted. This calculation yields a projection of the intra-burst data bus efficiency of the respective candidate command. In this embodiment, the interval in clock cycles is compared to a predetermined threshold in to determine if it is to be considered a high efficiency command.

At block 514, the process determines whether any cross-mode commands available as candidates have a high efficiency. If there are no high-efficiency cross-mode commands available, the process continues the current streak. Block 514 employs one or more efficiency conditions indicating inter-burst efficiency, which in this example is an efficiency indicator based on the potential CAS-to-CAS threshold of cross-mode commands. Generally, at block 514 an efficiency indicator is calculated for cross-mode commands which are available to be selected at the arbiter, and compared to one of thresholds 526 or 528 to determine if the cross-mode command is high efficiency. If the indicator is the CAS-to-CAS interval calculated directly in clock cycles, this indicator may be treated as a cost function in which low cost signals high efficiency. This check has the advantage of preventing a scenario, in which a turnaround is conducted, and then no high efficiency commands are available in the other mode and the process turns around again repeatedly. The thresholds used for cross-mode commands are a "Cross-Mode Write CAS Gap Threshold" 526, used for the comparison when read commands are the current mode, and a "Cross-Mode Read CAS Gap Threshold" 528, used when write commands are the current mode. In this embodiment, thresholds 526 and 528 are set based on an adjustable configuration register value, which is selected to account for the minimum CAS-to-CAS timing for the respective command type of command, the time it takes to perform a streak turnaround, the burst length employed (the number of data beats sent or pulled for each CAS command), and other considerations such as the possibility of rank switches and bank group switches.

If there are high-efficiency cross-mode commands available at block 514, the process goes to block 516, where it uses another type of intra-burst efficiency indicator to prevent a continuing sequence of commands that are just slightly within the high efficiency threshold but overall provide an inefficient streak. Block 516 calculates a "last 3" current mode CAS-to-CAS interval, which provides the interval between the most recently transmitted CAS command, and a prior CAS command occurring three CAS commands ago. If this "last 3" interval is greater than a designated threshold, the process ends the current streak and performs a turnaround.

If the "last 3" interval is within the designated threshold, the process at block 516 goes to block 518. At block 518, it checks whether there are high-efficiency current-mode commands available for the current mode by comparing the CAS-to-CAS intervals of the candidate commands to one of thresholds 522 or 524. If there are high-efficiency current-mode commands available, the process continues the current streak. If not, the process goes to block 520 where it ends the current streak. Ending the streak in each depicted case causes a turnaround process in which a streak of the other mode is begun.

As depicted by the threshold values feeding into block 518, two different thresholds 522 and 524 are used at block 518 to monitor efficiency of commands depending on whether the current mode is read or write. The thresholds used for current mode commands are a "Current-Mode Write CAS Gap Threshold" 522, used for the comparison when write commands are the current mode, and a "Current-Mode Read CAS Gap Threshold" 524, used when read commands are the current mode. In this embodiment, thresholds 522 and 524 are set based on an adjustable configuration register value, which is selected to account for the minimum CAS-to-CAS timing for the respective command type of command, the burst length employed (the number of data beats sent or pulled for each CAS command), and other considerations such as the possibility of rank switches and bank group switches, for example. Because a minimum desired burst length is already achieved, the depicted process allows greater flexibility in managing intra-burst efficiency as compared to a scheme that also needs to account for excessive streak turnaround related to the intra-burst efficiency management. In this embodiment, the intra-burst efficiency conditions monitored at block 512 are employed at blocks 516 and 518 to determine whether to end the streak. In other embodiments, block 516 is not used. In various embodiments, other process decision flows are employed to achieve a similar result.

While the process in this embodiment employs several different determinations in deciding whether to end the current streak, other embodiments may include fewer than all of the depicted conditional determinations. Further, while the various determinations in flowchart 500 are depicted in a particular order, this is not limiting and various embodiments can achieve similar functionality using circuitry which conducts selected blocks in a different order or simultaneously.

Memory controller 200 of FIG. 2 or any portions thereof, such as arbiter 238 and refresh control logic 232, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the internal architecture of memory channel controller 210 and/or power engine 250 may vary in different embodiments. Memory controller 200 may interface to other types of memory besides DDRx, such as high bandwidth memory (HBM) and the like. While the illustrated embodiment showed each rank of memory corresponding to separate DIMMs or SIMMs, in other embodiments each module can support multiple ranks. Still other embodiments may include other types of DRAM modules or DRAMs not contained in a particular module, such as DRAMs mounted to the host motherboard. Accordingly, it is intended by the appended claims to cover all modifications of the disclosed embodiments that fall within the scope of the disclosed embodiments.

What is claimed is:
1. A memory controller, comprising:
 a command queue having a first input for receiving memory access requests; and
 an arbiter coupled to the command queue for selecting entries from the command queue, and causing them to be transmitted over a memory channel, the arbiter operable to:
  transmit streaks of consecutive read commands and streaks of consecutive write commands over the memory channel;
  transmit a current streak of one of consecutive read commands or consecutive write commands for at least a minimum burst length based on a number of commands of a designated type available to be selected by the arbiter; and following the minimum burst length, based on whether no commands for a new streak are available for which a column-address-strobe (CAS) command can be sent within a first defined CAS-to-CAS interval, continue the current streak.

2. The memory controller of claim 1, wherein the minimum burst length is calculated as a number of available commands for the current streak times a selected ratio.

3. The memory controller of claim 1, wherein the arbiter is further operable to, following the minimum burst length, based on whether no commands for the current streak are available for which a CAS command can be sent within a second defined CAS-to-CAS interval, end the current streak.

4. The memory controller of claim 3, wherein the arbiter is further operable to: based on whether a total CAS-to-CAS interval for multiple commands of the current streak is above a third defined interval, end the current streak.

5. The memory controller of claim 3, wherein a first interval is used for the first defined CAS-to-CAS interval when the current streak is read commands, and a second interval different from the first interval is used for the first defined CAS-to-CAS interval when the current streak is write commands.

6. The memory controller of claim 5, wherein a third interval is used for the second defined CAS-to-CAS interval when the current streak is read commands, and a fourth interval different from the third interval is used for the second defined CAS-to-CAS interval when the current streak is write commands.

7. The memory controller of claim 1, wherein the first defined CAS-to-CAS interval is an interval between a most recently transmitted CAS command and a maximum time at which a selected subsequent CAS command can be transmitted.

8. A method, comprising:
causing streaks of consecutive read commands and streaks of consecutive write commands to be transmitted over a memory channel;
transmitting a current streak of one of consecutive read commands or consecutive write commands for at least a minimum burst length based on a number of commands of a designated type available to be selected by an arbiter; and
following the minimum burst length, based on whether no commands for a new streak are available for which a column-address-strobe (CAS) command can be sent within a first defined CAS-to-CAS interval, continuing the current streak.

9. The method of claim 8, wherein the minimum burst length is calculated as a number of available commands for the current streak times a selected ratio.

10. The method of claim 8, further comprising, following the minimum burst length, following the minimum burst length, based on whether no commands for the current streak are available for which a CAS command can be sent within a second defined CAS-to-CAS interval, ending the current streak.

11. The method of claim 10, wherein a first interval is used for the first defined CAS-to-CAS interval is used when the current streak is read commands, and a second interval different from the first interval is used for the first defined CAS-to-CAS interval when the current streak is write commands.

12. The method of claim 11, wherein a third interval is used for the second defined CAS-to-CAS interval when the current streak is read commands, and a fourth interval different from the third interval is used for the second defined CAS-to-CAS interval when the current streak is write commands.

13. The method of claim 10, further comprising, based on whether a total CAS-to-CAS interval for multiple commands of the current streak is above a third defined interval, ending the current streak.

14. The method of claim 8, wherein the first defined CAS-to-CAS interval is an interval between a most recently transmitted CAS command and a maximum time at which a selected subsequent CAS command can be transmitted.

15. A data processing system, comprising:
a processing unit;
a data fabric coupled to the processing unit; and
a memory controller coupled to the data fabric for fulfilling memory requests from the processing unit, the memory controller comprising:
a command queue having a first input for receiving memory access requests;
an arbiter coupled to the command queue for selecting entries from the command queue, and causing them to be transmitted over a memory channel to at least one dynamic random access memory, the arbiter operable to:
transmit streaks of consecutive read commands and streaks of consecutive write commands over the memory channel;
transmit a current streak of one of consecutive read commands or consecutive write commands for at least a minimum burst length based on a number of commands of a designated type available to be selected by the arbiter; and
following the minimum burst length, based on whether no commands for a new streak are available for which a column-address-strobe (CAS) command can be sent within a first defined CAS-to-CAS interval, continue the current streak.

16. The data processing system of claim 15, wherein the minimum burst length is calculated as a number of available commands for the current streak available times a selected ratio.

17. The data processing system of claim 15, wherein the arbiter is further operable to, following the minimum burst length, based on whether no commands for the current streak are available for which a CAS command can be sent within a second defined CAS-to-CAS interval, end the current streak.

18. The data processing system of claim 17, wherein a first interval is used for the first defined CAS-to-CAS interval is used when the current streak is read commands, and a second interval different from the first interval is used for the first defined CAS-to-CAS interval when the current streak is write commands.

19. The data processing system of claim 18, wherein a third interval is used for the second defined CAS-to-CAS interval when the current streak is read commands, and a fourth interval different from the third interval is used for the second defined CAS-to-CAS interval when the current streak is write commands.

20. The data processing system of claim 17, wherein the arbiter is further operable to, based on whether a total CAS-to-CAS interval for multiple commands of the current streak is above a third defined interval, end the current streak.

* * * * *